US 7,039,573 B2

(12) United States Patent
Komoda

(10) Patent No.: US 7,039,573 B2
(45) Date of Patent: May 2, 2006

(54) METHOD OF FORMULATING LOAD MODEL FOR GLITCH ANALYSIS AND RECORDING MEDIUM WITH THE METHOD RECORDED THEREON

(75) Inventor: Michio Komoda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 939 days.

(21) Appl. No.: 09/970,878

(22) Filed: Oct. 5, 2001

(65) Prior Publication Data

US 2002/0087294 A1    Jul. 4, 2002

(30) Foreign Application Priority Data

Dec. 28, 2000    (JP)    ............... 2000-402788

(51) Int. Cl.
*G06F 17/50*    (2006.01)
*G06F 17/10*    (2006.01)
*G06F 9/45*    (2006.01)

(52) U.S. Cl. .............. 703/14; 703/2; 716/4; 716/5; 716/6

(58) Field of Classification Search .............. 703/2, 703/14; 716/4–6
See application file for complete search history.

(56) References Cited

U.S. PATENT DOCUMENTS

| | | | |
|---|---|---|---|
| 6,353,917 B1 * | 3/2002 | Muddu et al. ............. | 716/6 |
| 6,378,109 B1 * | 4/2002 | Young et al. ............. | 716/4 |
| 6,405,348 B1 * | 6/2002 | Fallah-Tehrani et al. ....... | 716/4 |
| 6,493,853 B1 * | 12/2002 | Savithri et al. ............. | 716/5 |
| 6,925,624 B1 * | 8/2005 | Komoda ............. | 716/10 |
| 2002/0060572 A1 * | 5/2002 | Komoda ............. | 324/519 |

FOREIGN PATENT DOCUMENTS

| | | |
|---|---|---|
| JP | 4-337869 | 11/1992 |
| JP | 6-34665 | 2/1994 |

OTHER PUBLICATIONS

Ye, Lun et al. "Chip-Level Verification for Parasitic Coupling Effects in Deep-Submicron Digital Designs." Proc. DAC in Europe. 1999.*
Gross, Paul et al. "Determination of Worst-Case Aggressor Alignment for Delay Calculation." Proc. 1998 IEEE/ACM Int'l Conf. on CAD. 1998. pp. 212-219.*

(Continued)

*Primary Examiner*—Paul L. Rodriguez
*Assistant Examiner*—Ayal Sharon
(74) *Attorney, Agent, or Firm*—Buchanan Ingersoll PC

(57) ABSTRACT

The total resistance value of a coupling portion between first and second circuits is used as the resistance value of a load model; one-half of the total capacity value of the coupling portion is used as each coupling capacity value of the load model; the sum of one-half of the total earth capacity value of the coupling portion and the total capacity value of a non-coupling portion near a first circuit driver is used as the earth capacity value of the load model at a point near the first circuit driver; and the sum of one-half of the total earth capacity value of the coupling portion and the total capacity value of a non-coupling portion farther from the first circuit driver than the coupling portion is used as the earth capacity value of the load model at a point remote from the first circuit driver.

8 Claims, 7 Drawing Sheets

OTHER PUBLICATIONS

Kim, S.Y. et al. "An Efficient Methodology for Extraction and Simulation of Transmission Lines for Application Specific Electronic Modules." Proc. of the 1993 IEEE/ACM Int'l Conf. on CAD. 1993. pp. 58-65.*

ARCADIA User's Manual. Version 1.1. Feb. 1995.*

Cong, Jason et al. "Improved Crosstalk Modeling for Noise Constrained Interconnect Optimization." Proc. IEEE/ACM TAU. Dec. 4-5, 2000. Austin, Texas.*

Cong, Jason et al. "Improved Crosstalk Modeling with Applications to Noise Constrained Interconnect Optimization." Proc. SRC Techcon Conf., Sep. 21-23, 2000. Phoenix, Arizona.*

David Z. Pan's Patents and Publications. http://www.ece.utexas.edu/~dpan/publications/ Printed on Jun. 17, 2005.*

Blackwell, G.R. "Chapter 5: Circuit Boards." The Electronic Packaging Handbook. CRC Press LLC. 2000. Boca Raton, FL.*

Majumdar, A. et al. "Ground Bounce Considerations in DC Parametric Test Generation Using Boundary Scan." Proc. 16th IEEE VLSI Test Symposium, 1998. Apr. 26-30, 1998. pp. 86-91.*

D'Amore, M. et al. "A New Efficient Procedure for the Transient Analysis of Dissipative Power Networks with Non-linear Loads." IEEE Transactions on Power Delivery. Jan. 1996. vol. 11, Issue 1, pp. 533-539.*

* cited by examiner

EXAMPLE OF GLITCH

METHOD OF FORMULATING LOAD MODEL FOR GLITCH ANALYSIS AND RECORDING MEDIUM WITH THE METHOD RECORDED THEREON

BACKGROUND OF THE INVENTION

1. Field of the Invention

The present invention relates to a method of formulating a load model for glitch analysis that is used to locate a circuit part where a glitch error occurs (an error under the influence of the adjoining circuit) and a recording medium on which there is recorded the load model formulating method in the form of a computer program.

2. Description of the Prior Art

FIG. 8 depicts a circuit configuration for locating a circuit part where a glitch error occurs. In the case where a first circuit is electrically affected by a second circuit adjacent thereto, a coupling capacitance (Cc) develops between wires of the first and second circuits. (The first circuit is commonly called a victim and the second circuit an aggressor; in some cases a plurality of aggressors are present.) In this instance, upon operation of the second circuit, such a pulse-shaped signal change as depicted in FIG. 9 is caused in the first circuit at a point A even if the latter is out of operation. Such a signal change is commonly referred to as a glitch.

When the amount of glitch exceeds a certain value, the resulting pulse is likely to cause malfunction of the first circuit. Hence, when it is expected that a glitch will occur in excess of a certain value, the circuit needs to be corrected to keep the glitch from going beyond a threshold value, which is preset by a circuit analysis. Accordingly, it is necessary to decide the need for circuit correction by accurately estimating the amount of glitch likely to occur in the given circuit configuration.

FIG. 10 shows a known method that accurately estimates the amount of glitch by analyzing a load model representing each wire part by an n-stage $\pi$-type RC (n=2 in this example). This method permits highly accurate estimation of the amount of glitch, but requires a large amount of circuit data and hence consumes much time for analysis. Since the number of signal lines in the circuit is nearly a million, it is impractical to calculate the amount of glitch for every signal line.

Hence, it is customary in the prior art to adopt a method that analyzes approximate values of glitches by the use of a load model, then extracts from the load model a circuit part (net) where a glitch error is likely to occur, and makes an analysis with a detailed load model, such as depicted in FIG. 10, to make a final decision on the necessity for circuit correction. The load model used in the prior art is such a $\pi$-type load model as shown in FIG. 11. Let represents the sum total of wiring resistance values of a first circuit be represented by R, which is set as the resistance of the $\pi$-type load. Let the sum total of earth capacities be represented by Cs and the sum total of coupling capacitances by Cc. Each capacitance component is divided using an empirically preset coefficient $\beta$ (where $0<\beta<1$), and is connected in an inverse ratio. A first circuit driver is approximated by a resistor of a resistance value Rs. To the other end of the coupling capacitance Cc is input a waveform distortion that is observed at a terminal T1 of a second circuit driver. Incidentally, the waveform distortion that is observed at the terminal T1 is an amount that is obtained in an ordinary signal propagation delay calculating stage.

Since the conventional load model has such a configuration as described above, the load configuration is simple and always remains the same, and since only the value of each element or the amount of waveform distortion changes, the conventional load model permits fast calculation of the glitch value. However, the glitch value thus calculated seriously differs from the actual glitch value for the reasons given below.

1. Since the dividing ratio $\beta$ is a value obtained empirically and does not depend on the actual circuit configuration, the division of each capacitance component may sometimes become inappropriate.

2. Since the resistance value R and the capacitance value C are each in the form of sum total and since the dividing ratio is also fixed, the same load model is always formulated and the same analysis result is produced even for circuit configurations that differ only in the coupling position, for example. In practice, however, different coupling positions provide different glitch values.

3. The waveform distortion at the terminal T1, which is used as the input waveform of the coupling capacitance Cc of the second circuit, is the steepest in the wiring of the second circuit; hence, in some cases the glitch value becomes larger than the actual value. Further, the same glitch value is produced regardless of whether signals propagate in the same or different directions in the first and second circuits, but in practice, the glitch value differs according to the direction of signal propagation.

When the calculated glitch value greatly differs from the actual one, it may sometimes remain undetected as an error. As a solution to this problem, it is necessary to employ a method that makes, in a simple calculation stage, an error decision under stricter conditions than in the case of usual error decision and uses a detailed load model to decide whether the error decision is true or not. Moreover, there are cases where the difference between the calculated glitch value and the actual one, which need not be decided as an error, is classified to be an error candidate as a large glitch value through simple analysis; hence, many signal lines are selected as signal lines that need to be subjected to a detailed error analysis. However, it is considered that such signal lines mostly have no problem. Accordingly, the prior art conducts a detailed analysis of an unnecessarily large number of signal lines, and hence it is time-consuming.

SUMMARY OF THE INVENTION

It is therefore an object of the present invention to provide a load model formulating method for high accuracy glitch analysis that permits a rough calculation with the load model and makes it possible to properly narrow down signal lines in which an error is likely to occur.

Another object of the present invention is to provide a recording medium on which there is recorded the load formulating method in the form of a computer program.

In the method of formulating a load model for glitch analysis according to the present invention: the total resistance value of a coupling portion between a first circuit, which is electrically affected by a circuit adjoining it, and a second circuit is used as the resistance value of a load model; one-half of the total capacity value of the coupling portion is used as each coupling capacity value of the load model; the sum of one-half of the total earth capacity value of the coupling portion and the total capacity value of a non-coupling portion near a first circuit driver is used as the earth capacity value of the load model at a point near the first circuit driver; and the sum of one-half of the total earth capacity value of the coupling portion and the total capacity value of a non-coupling portion farther from the first circuit driver than the coupling portion is used as the earth capacity value of the load model at a point remote from the first circuit driver. With such an arrangement, a glitch value can be estimated relatively accurately in a short time by first simple checking of all wires. Hence, it is possible to prevent an increase in the number of circuits in need of time-consuming, detailed checking and to avoid an error at the simple checking stage.

According to another aspect of the present invention, a waveform distortion that is provided to one end of a coupling capacitive element of a simple π-type load model is a waveform distortion of a second circuit corresponding to that side of the coupling portion which is the farthest from a first circuit driver. Therefore, it is possible to select an appropriate waveform distortion of the second circuit.

According to another aspect of the present invention, a waveform distortion that is provided to one end of a coupling capacitive element of a simple π-type load model is an average value of waveform distortions in the coupling portion of the second circuit. Therefore, it is possible to select an appropriate potential average value of the second circuit.

According to another aspect of the present invention, when a branch line is present in the coupling portion, the total earth capacity value of the branch line and the total capacity value of the coupling portion are divided by a reciprocal ratio of the resistance values of the coupling portion before and after the branching point, and the divided capacity values are added to capacitive elements of the load model. This ensures the construction of an appropriate load model even if a branch is present in the coupling.

According to another aspect of the present invention, when the coupling portion is present discontinuously on a path, the entire area in which the coupling portion is discontinuously present is regarded as one coupling portion. Accordingly, it is possible to handle a second circuit in which a coupling portion is discontinuous.

According to another aspect of the present invention, in the case where no coupling portion is present on a path and the coupling portion is present only in a branch line, the entire path is regarded as a coupling portion with no coupling capacity. Accordingly, it is possible to deal with the case where the coupling portion is present only in other portion than the path.

According to another aspect of the present invention, since the total resistance value of the side further to the first circuit driver than the coupling portion is added to the source resistance of the first circuit driver, it is possible to assign the optimum value including the source resistance.

According to still another aspect of the present invention, a recording medium has recorded thereon a computer program for implementing the load model formulating method.

DETAILED DESCRIPTION OF THE PREFERRED EMBODIMENTS

Embodiment 1

Figure 1:
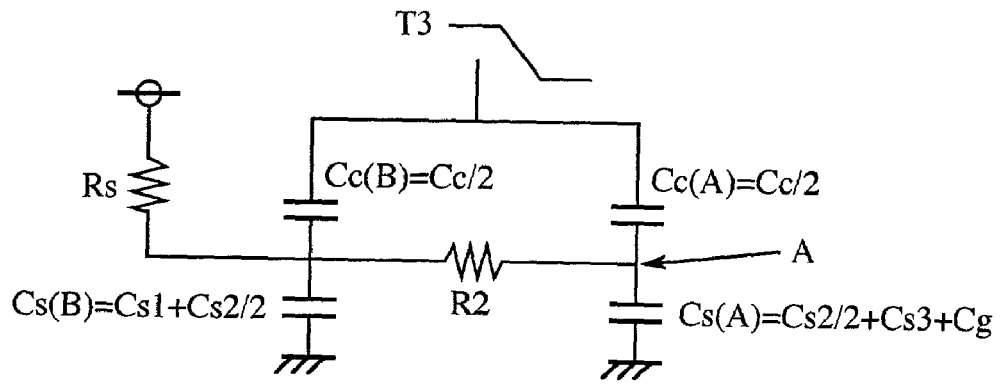
FIG. 1 is a diagram illustrating a load model formulated according to a first embodiment of the present invention.

FIG. 1 is a diagrammatic representation of a load model formulated by the load model formulating method of the present invention. In FIG. 1:

(1) The total resistance value of the coupling portion is calculated and used as the resistance value R2 of the load model;

(2) The total capacitance value of the coupling portion is calculated, and a capacitance value one-half the total capacitance value is used as each of two capacitance values Cc of the load model;

(3) The earth capacity value Cs(B) near the first circuit driver side is a sum of a value one-half the total earth capacity value (Cs2 in this case) of the coupling portion, and the total earth capacity value of a non-coupling portion near the first circuit driver as viewed from the coupling portion (Cs1 in this case).

Figure 8:
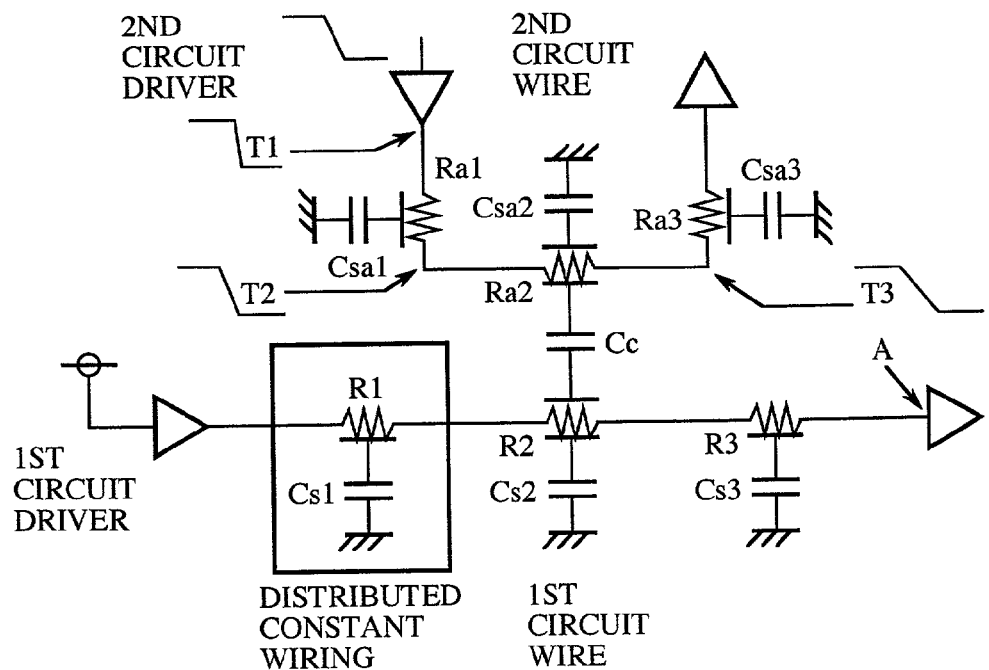
FIG. 8 is a circuit diagram showing an example of the application of a conventional load model formulating method.
Figure 9:
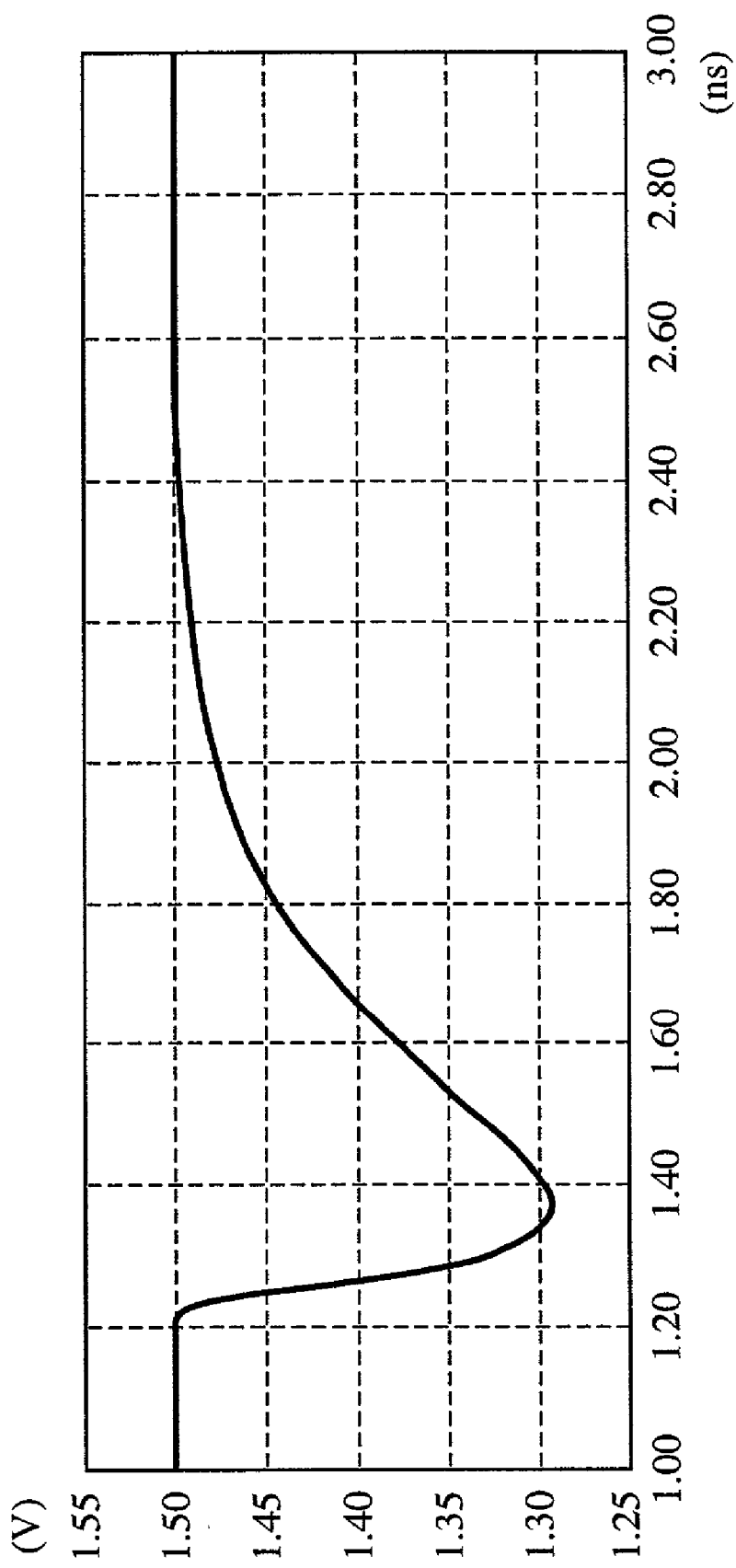
FIG. 9 is a graph showing the occurrence of a glitch.
Figure 10:
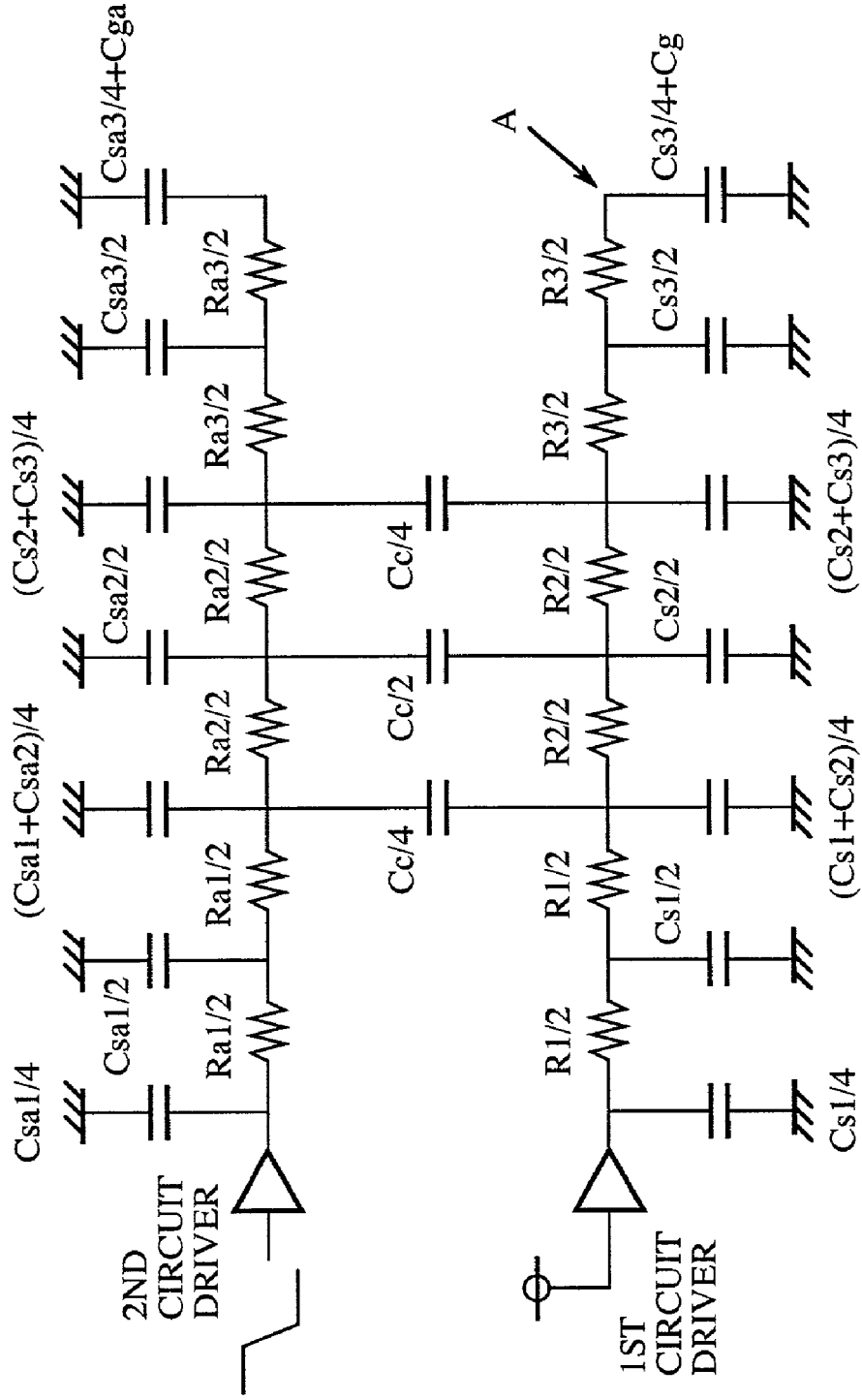
FIG. 10 is a circuit diagram showing another example of the application of a conventional load model formulating method.
Figure 11:
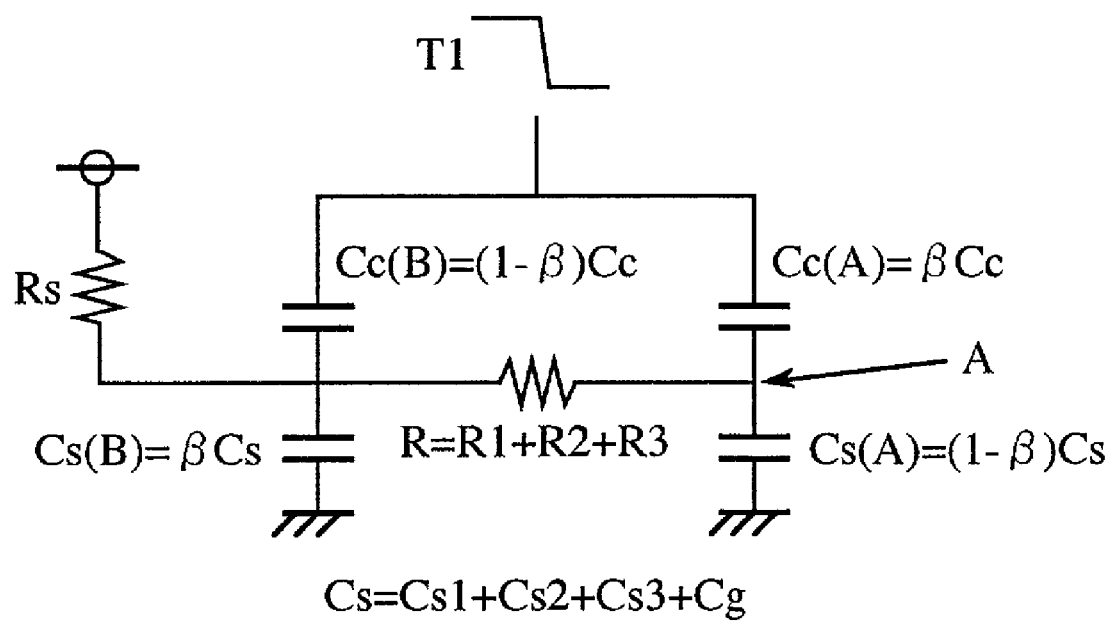
FIG. 11 is a diagrammatic representation of a conventional load model.

(4) The earth capacity value Cs(A) far away from the first circuit driver is a sum of the value one-half the total earth capacity of the coupling portion and the total earth capacity value of a non-coupling portion far from the first circuit driver as viewed from the coupling portion (in this case, Cs3+Cg, where Cg is the gate capacitance value of the next-stage cell); and (5) The waveform distortion that is provided to the total capacitance value Cc of the coupling portion of the load model is observed at a point of the second circuit (at a terminal T3 in this case) that is a coupling point farthest from the first circuit driver. Alternatively, an average value of waveform distortions at terminals T2 and T3 in FIG. 8 is used. This waveform distortion can be obtained at the stage of signal propagation delay as in the prior art.

In the present invention, since the load model is formulated as described above, the resistance and capacitance values can properly assigned according to the circuit construction used. For example, when the coupling position is further to the first circuit driver than in FIG. 8, the earth capacity Cs1 decreases and the earth capacity Cs3 increases, causing the glitch value to decrease. This is also reflected on the model; that is, the earth capacity value Cs at the point near the first circuit driver decreases and the earth capacity value Cs at the point far from the first circuit driver increases, decreasing the glitch value to be analyzed. In this way, it is possible to calculate the glitch value that varies with the position of coupling.

Since the waveform distortion of the second circuit is used which corresponds to the point (the terminal 3) that is the farthest from the first circuit driver among the coupling portions, it is possible to avoid the use of too much sharp a waveform distortion that occurs at the time of using a waveform at the output end of the second circuit driver.

Figure 2:
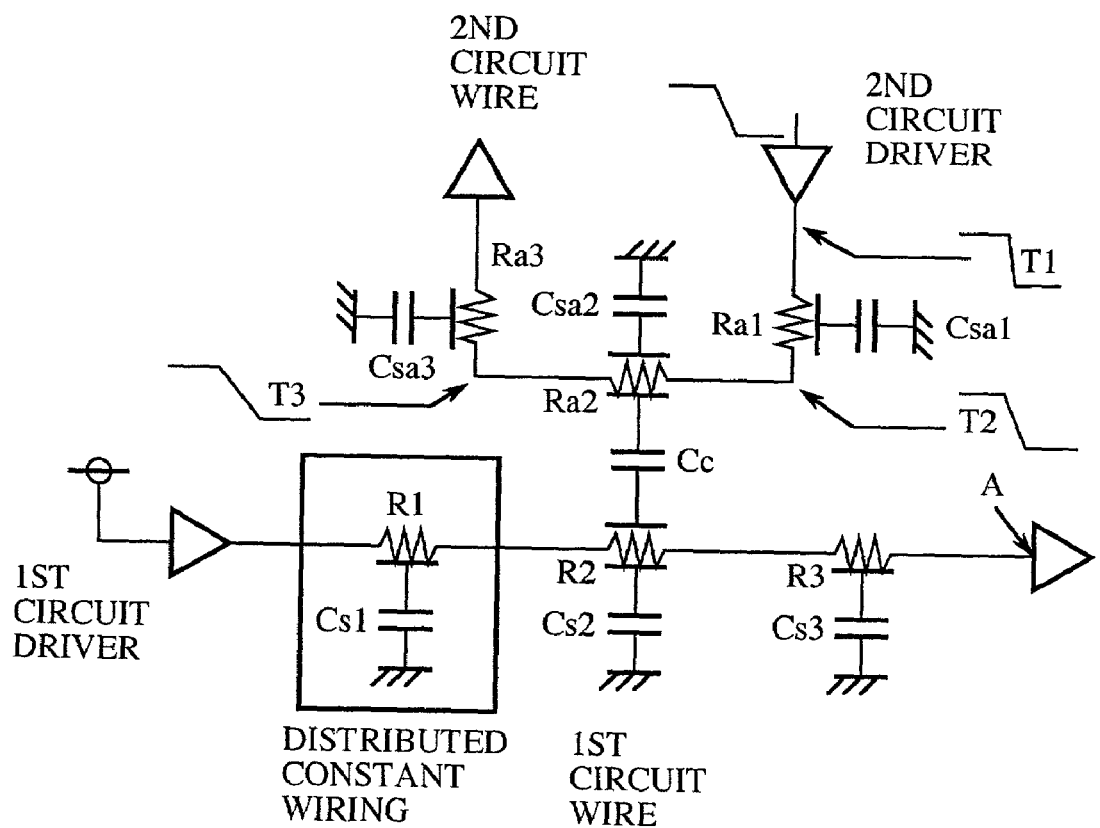
FIG. 2 is a circuit diagram showing an example of the application of the load model formulating method according to the first embodiment.

Moreover, when the direction of propagation of the signal in the second circuit is opposite to the direction of signal propagation in the first circuit, the glitch value goes larger than in the case of FIG. 8, but in the load model the waveform distortion at the terminal T2 is chosen and this waveform distortion is sharper than that at the terminal T3; hence, it is possible to calculate the difference between the circuits of FIGS. 8 and 2.

As described above, according to this embodiment, it is possible to promptly construct a load model for high-accuracy glitch analysis and select the appropriate waveform distortion of the second circuit.

Embodiment 2

Figure 3:
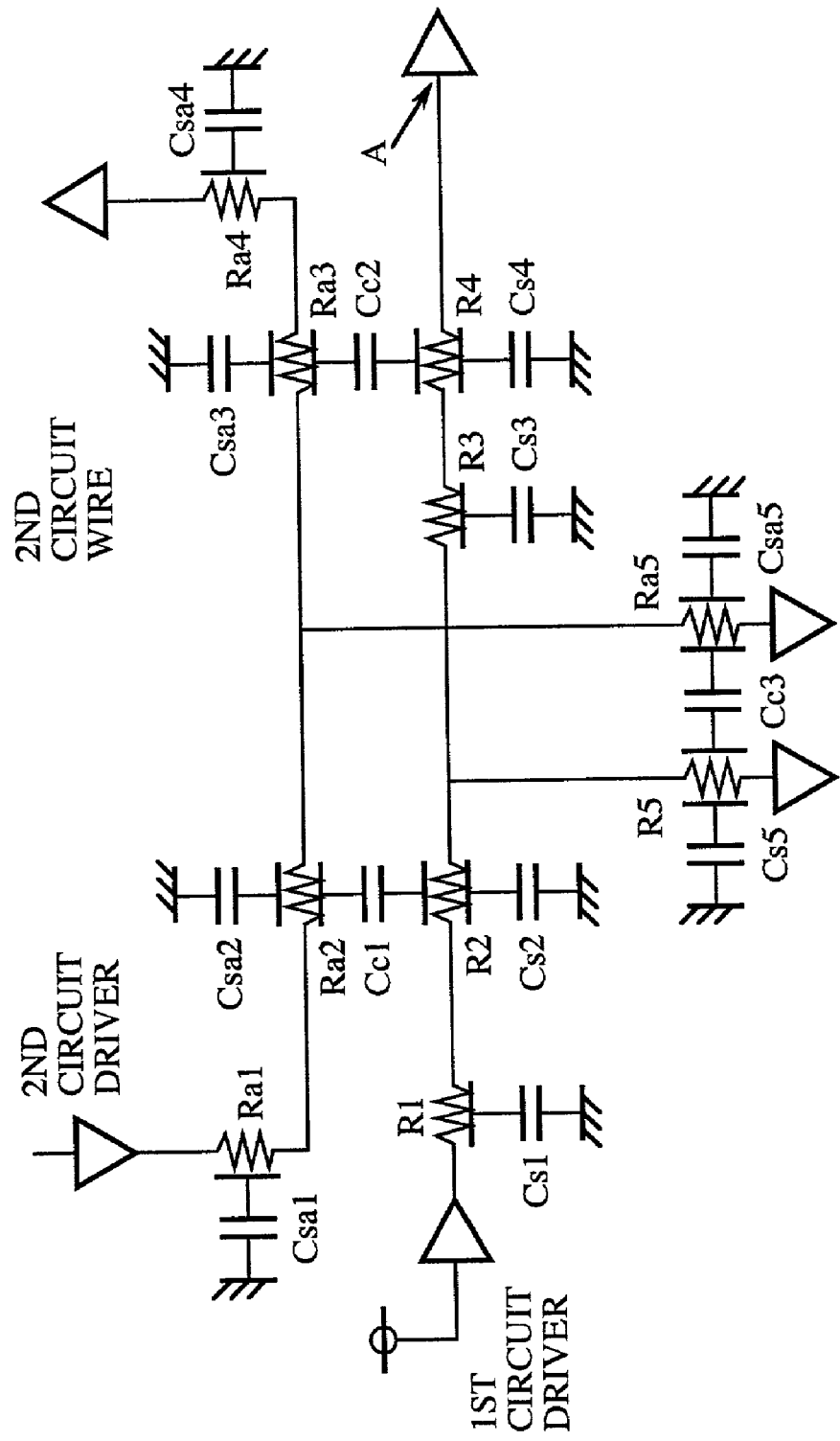
FIG. 3 is a circuit diagram showing another example of the application of the load model formulating method according to the first embodiment.

FIG. 3 depicts a circuit of a second embodiment (Embodiment 2) of the present invention, in which a coupling portion is present across a branch line. A description will be given of the formulation of a load model corresponding to the point A for the use of the present invention in such a case. The method of constructing the load model for the path to the point A is the same as in the first embodiment.

As regards the branch line in the coupling portion, the total resistance value (R2 in this case) of the coupling portion near the first circuit driver and the total resistance value (R3 in this case) remote from the first circuit driver are calculated for the branch position on the path to the point A, and the ratio x of the total resistance value of the coupling portion near the driver to the total resistance value of the coupling is calculated. In this instance, x=R2/(R2+R3).

For the portion branched from the coupling portion, the total coupling capacity value (Cc3 in this case) and the total earth capacity value (Cs5+Cg in this case, where Cg is the gate capacity at the terminating end of the branch line) are calculated, and (the total coupling capacity value)×x and (the total earth capacity value)×x are added to a capacitive element at a point remote from the first circuit driver, and (the total coupling capacity value)×(1−x) and (the total earth capacity value)×(1−x) are added to a capacitive element at a point near the first circuit driver.

Figure 4:
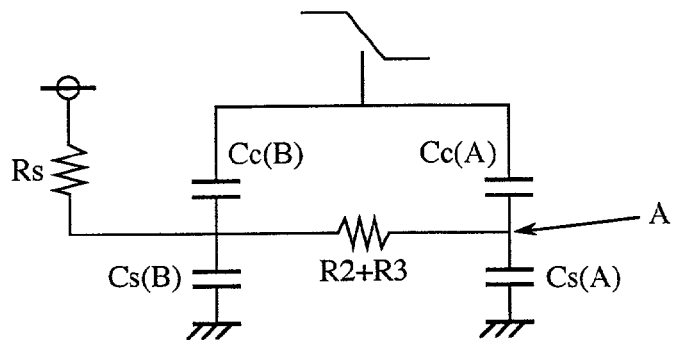
FIG. 4 is a diagram illustrating a load model formulated according to a second embodiment of the present invention.

As described above, according to this embodiment, since the branch is dealt with as mentioned above, it is possible to construct an appropriate model as shown in FIG. 4 even if a branch is present in the coupling.

Incidentally, assume that the following equations hold in FIG. 4.

$$X=R2/(R2+R3)$$

$$Cc(A)=(Cc1+Cc2)/2+xCc3$$

$$Cc(B)=(Cc1+Cc2)/2+(1-x)Cc3$$

$$Cs(A)=Cs4+CgA+(Cs2+Cs3)/2+x(Cs5+Cg)$$

$$Cs(B)=Cs1+(Cs2+Cs3)/2+(1-x)(Cs5+Cg)$$

where CgA is the gate capacitance at the one end A and Cg is the gate capacity at the other end.

In the above, no resistance value other than that of the coupling portion is used, but when the path resistance R on the side of the first circuit driver, rather than in the coupling portion, is larger than the source resistance Rs of the first circuit driver, this resistance is used for assignment of the optimum value.

Embodiment 3

Figure 5:
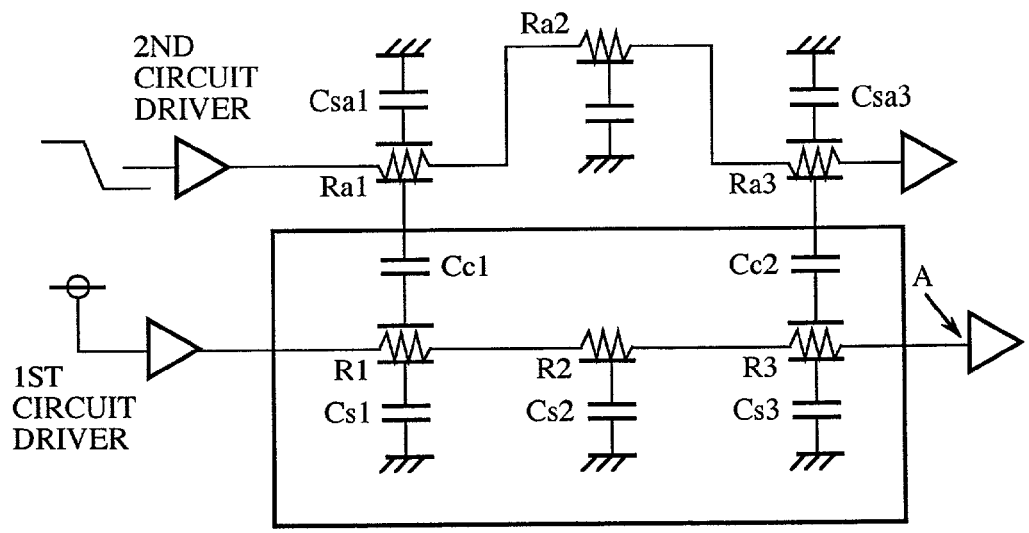
FIG. 5 is a circuit diagram showing an example of the application of the load model formulating method according to the second embodiment.

FIG. 5 depicts a circuit to which the load model formulating method of the present invention is applied and in which coupling portions are present discontinuously. In this instance, the range in which the coupling portions are present (surrounded by the solid line) is regarded as one coupling portion and the same processing as described above is carried out. The load model after processing can be expressed as shown in FIG. 6; thus, it is possible to handle the second circuit in which coupling portions are present discontinuously.

Figure 6:
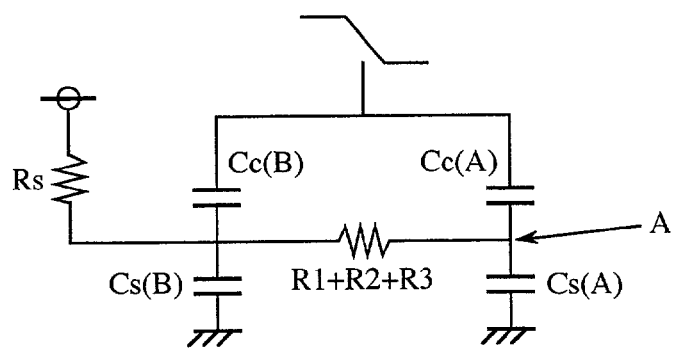
FIG. 6 is a diagram illustrating a load model formulated according to a third embodiment of the present invention.

Incidentally, let it be assumed that the following equations hold in FIG. 6.

$$Cc(A)=(Cc1+Cc2)/2$$

$$Cc(B)=(Cc1+Cc2)/2$$

$$Cs(A)=(Cs1+Cs2+Cs3)/2+CgA$$

$$Cs(B)=(Cs1+Cs2+Cs3)/2$$

where CgA is the gate capacity at the point A.

Embodiment 4

Figure 7:
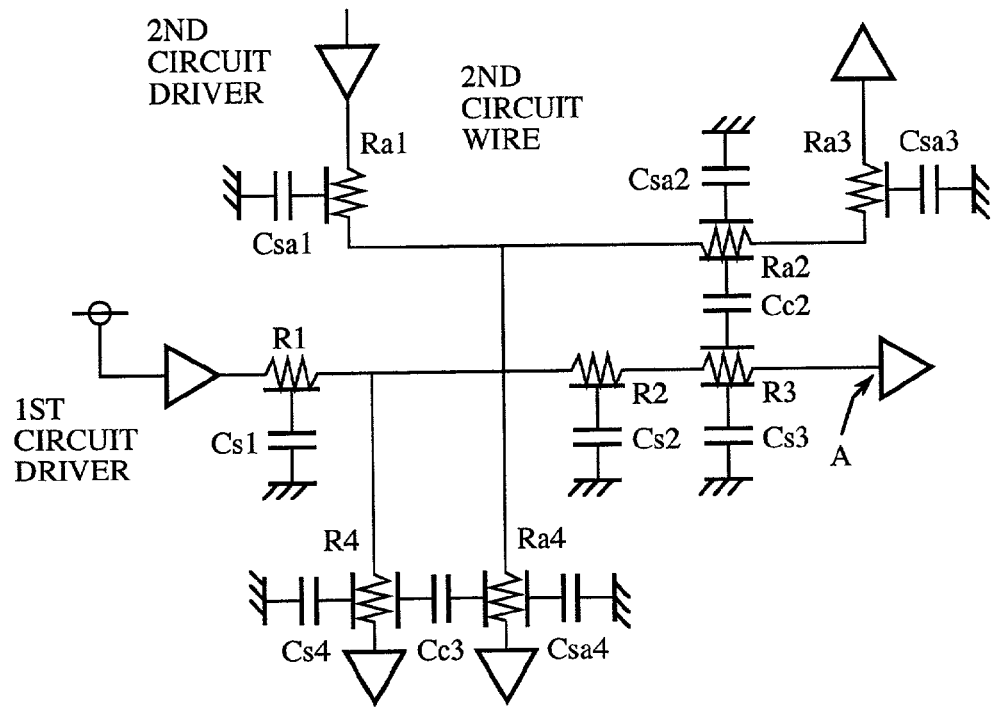
FIG. 7 is a circuit diagram showing an example of the application of the load model formulating method according to the third embodiment.

FIG. 7 is a circuit to which the load model formulating method of the present invention is applied. In the case where coupling portions are discontinuously present at the branching position and the target portion is out of the coupling portion, the coupling capacity of that portion is added to the coupling capacity Cc(B) when the coupling portion is near the first circuit driver, and to the coupling capacity Cc(A) when the coupling portion is remote from the first circuit driver. For example, in the case of analyzing a glitch at the point A in FIG. 7, the coupling capacity Cc3 is added to the coupling capacity Cc(B); thus, it is possible to handle the second circuit in which coupling portions are present discontinuously.

Embodiment 5

In the case where no coupling portion is present on the path from the first circuit driver to the analysis point but a coupling portion is present in a branch line, the entire line is regarded as a coupling range in which the coupling capacity Cc is zero, and the same processing as in the second embodiment 2 is performed for coupling portions present on other paths; thus, it is possible to cope with the case where the coupling portion is present only on a path other than that from the first circuit driver to the analysis point.

Embodiment 6

This embodiment is to record on a recording medium a computer program for implementing the load model formulating method according to each of the first to fifth embodiments described above. By executing the recorded program, the load model formulating method of the present invention can immediately be carried out.

What is claimed is:

1. A computer-implemented method of formulating a load model for glitch analysis in which: the total resistance value of a coupling portion of a first circuit to a second circuit is used as the resistance value of a load model; one-half of the total capacity value of the coupling portion is used as each coupling capacity value of the load model; a sum of one-half of the total ground capacity value of the coupling portion and the total capacity value of a non-coupling portion near a first circuit driver is used as the ground capacity value of the load model at a point near the first circuit driver; and a sum of one-half of the total ground capacity value of the coupling portion and the total capacity value of a non-coupling portion farther from the first circuit driver than the coupling portion is used as the ground capacity value of the load model at a point remote from the first circuit driver.

2. The method according to claim 1, wherein a waveform distortion that is provided to one end of a coupling capacitive element of a simple π-type load model is a waveform distortion of the second circuit corresponding to that side of the coupling portion which is the farthest from the first circuit driver.

3. The method according to claim 1, wherein a waveform distortion that is provided to one end of a coupling capacitive element of a simple π-type load model is an average value of waveform distortions in a coupling portion of the second circuit to the first circuit.

4. The method according to claim 1, wherein, when a branch line is present in the coupling portion, the total ground capacity value of the branch line and the total capacity value of a coupling portion of the branch line to the second line are divided by a reciprocal ratio of the resistance values of the coupling portion before and after the branching point, and the divided capacity values are added to capacitive elements of the load model.

5. The method according to claim 1, wherein, when the coupling portion is present discontinuously on a path, the entire area in which the coupling portion is discontinuously present is regarded as one coupling portion.

6. The method according to claim 1, wherein, in the case where no coupling portion is present on a path and the coupling portion is present only in a branch line, the entire path is regarded as a coupling portion with no coupling capacity.

7. The method according to claim 1, wherein the total resistance value of the side near the first circuit driver from the coupling portion is added to a source resistance of the first circuit driver.

8. A recording medium on which there is recorded a computer program for implementing the load model formulating method according to claim 1.

* * * * *